(12) United States Patent
Ahn et al.

(10) Patent No.: US 11,664,359 B2
(45) Date of Patent: May 30, 2023

(54) DISPLAY APPARATUS

(71) Applicant: SAMSUNG DISPLAY CO., LTD., Yongin-si (KR)

(72) Inventors: Yijoon Ahn, Yongin-si (KR); Eoksu Kim, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 84 days.

(21) Appl. No.: 17/189,349

(22) Filed: Mar. 2, 2021

(65) Prior Publication Data
US 2021/0407981 A1    Dec. 30, 2021

(30) Foreign Application Priority Data

Jun. 30, 2020  (KR) .......................... 10-2020-0080501

(51) Int. Cl.
| | |
|---|---|
| *H01L 25/18* | (2023.01) |
| *H10K 59/131* | (2023.01) |
| *H10K 71/00* | (2023.01) |
| *H01L 23/00* | (2006.01) |
| *H01L 25/00* | (2006.01) |
| *H01L 27/32* | (2006.01) |

(52) U.S. Cl.
CPC .............. *H01L 25/18* (2013.01); *H01L 24/73* (2013.01); *H01L 24/92* (2013.01); *H01L 25/50* (2013.01); *H01L 27/3276* (2013.01); *H01L 24/16* (2013.01); *H01L 24/32* (2013.01); *H01L 2224/16145* (2013.01); *H01L 2224/32145* (2013.01); *H01L 2224/73204* (2013.01); *H01L 2224/92125* (2013.01); *H01L 2251/566* (2013.01); *H01L 2924/14335* (2013.01)

(58) Field of Classification Search
None
See application file for complete search history.

(56) References Cited

U.S. PATENT DOCUMENTS

| | | | |
|---|---|---|---|
| 9,933,644 B2 | 4/2018 | Kim et al. | |
| 10,617,005 B2 | 4/2020 | Lee | |

FOREIGN PATENT DOCUMENTS

| | | |
|---|---|---|
| KR | 1020050050933 A | 6/2005 |
| KR | 1020150145827 A | 12/2015 |
| KR | 1020180041301 A | 4/2018 |
| KR | 1020180077835 A | 7/2018 |
| KR | 102013323 B1 | 8/2019 |

*Primary Examiner* — Telly D Green
(74) *Attorney, Agent, or Firm* — Cantor Colburn LLP

(57) ABSTRACT

A display apparatus includes a display panel including a first surface and a second surface, where a display area which displays images is arranged in the first surface; a driving panel arranged on the display panel and including a first surface and a second surface; and a filling portion filled between the display panel and the driving panel. The display panel and the driving panel are stacked in a vertical direction in a cross-sectional view, and signal lines of the display panel may be electrically connected to signal lines of the driving panel, respectively, through a contact hole penetrating the display area and the driving panel.

11 Claims, 16 Drawing Sheets

DISPLAY APPARATUS

This application claims priority to Korean Patent Application No. 10-2020-0080501, filed on Jun. 30, 2020, and all the benefits accruing therefrom under 35 U.S.C. § 119, the content of which in its entirety is herein incorporated by reference.

BACKGROUND

1. Field

One or more embodiments relate to a display apparatus and a method of manufacturing the same.

2. Description of Related Art

Generally, a display apparatus may be used in a mobile device, such as a smart phone, a laptop computer, a digital camera, a camcorder, a portable information terminal, a notebook, or a tablet personal computer, or in an electronic device such as a desktop computer, a television, an outdoor billboard, a display apparatus for exhibition, a dashboard for a vehicle, or a head up display ("HUD").

The display apparatus includes a peripheral area which is not directly involved in generating light, which is referred to as a dead space, in addition to a display area for displaying images. Signal lines, drivers, or the like may be arranged in the dead space and may be electrically connected to elements in the display area.

SUMMARY

An area occupied by the dead space needs to be reduced to obtain a display apparatus capable of displaying a full-screen image.

One or more embodiments provide a display apparatus in which dead space is minimized, and a method of manufacturing the same.

Additional aspects will be set forth in part in the description which follows and, in part, will be apparent from the description, or may be learned by practice of the presented embodiments of the disclosure.

A display apparatus according to an aspect of the present disclosure includes a display panel including a first surface and a second surface opposite to the first surface where a display area which displays images is arranged in the first surface: a driving panel arranged on the display panel and including a first surface and a second surface, where the first surface of the driving panel faces the second surface of the display panel, and the second surface of the driving panel is opposite to the first surface of the driving panel; and a filling portion filled between the display panel and the driving panel. The display panel and the driving panel may be stacked in a vertical direction in a cross-sectional view, and signal lines of the display panel may be electrically connected to signal lines of the driving panel, respectively, through a contact hole penetrating the display panel and the driving panel.

According to an embodiment, the contact hole may include a plurality of first contact holes and a plurality of second contact holes, the plurality of first contact holes may be defined in the display panel, and the plurality of second contact holes may be defined in the driving panel.

According to an embodiment, a plurality of first signal lines electrically connected to the display area may be arranged on the first surface of the display panel, a plurality of second signal lines electrically connected to the plurality of first signal lines and a driver electrically connected to the plurality of second signal lines may be arranged on the first surface of the driving panel, and an integrated circuit ("IC") electrically connected to the driver may be arranged on the second surface of the driving panel.

According to an embodiment, a first connection portion may be arranged on the second surface of the display panel, and may be electrically connected to the Arts plurality of first signal lines through the plurality of first contact holes, and a second connection portion may be arranged on the first surface of the driving panel to contact the first connection portion and be electrically connected to the plurality of second signal lines.

According to an embodiment, a bumper may be between the first connection portion and the second connection portion.

According to an embodiment, a plurality of third signal lines may be electrically connected to the driver and arranged on the first surface of the driving panel, a plurality of fourth signal lines may be electrically connected to the IC and arranged on the second surface of the driving panel, and each of the plurality of third signal lines may be electrically connected to the plurality of fourth signal lines via each of the plurality of second contact holes.

According to an embodiment, the driver arranged in the driving panel may apply a signal to a display element arranged in the display area.

According to an embodiment, the filling portion may be filled in a gap between the second surface of the display panel and the first surface of the driving panel.

According to an embodiment, the display panel may overlap the driving panel in a plan view, and a size of the driving panel is less than a size of the display panel.

According to an embodiment, the driving panel may include a first driving panel and a second driving panel, the first driving panel may be arranged on an upper portion of the display panel, and the second driving panel may be arranged on a lower portion of the display panel in the plan view.

According to an embodiment, the signal lines of the display panel and the signal lines of the driving panel may be arranged on substrates, respectively, and the substrates may include the same material.

A method of manufacturing a display apparatus according to another aspect of the present disclosure includes preparing a mother substrate, patterning a plurality of display panels and a plurality of driving panels on the mother substrate, dividing the plurality of display panels and the plurality of driving panels into a single display panel and a single driving panel, respectively, electrically connecting the single display panel to the single driving, and filling a filling portion between the single display panel and the single driving panel.

According to an embodiment, the method may further include patterning, on a first surface of the mother substrate, components to be patterned on a first surface of the display panel and a first surface of the driving panel, and patterning, on a second surface of the mother substrate, components to be patterned on a second surface of the display panel and a second surface of the driving panel, wherein the second surface of the display panel and the first surface of the driving panel may be coupled to face each other.

According to an embodiment, a plurality of signal lines may be formed in each of the display panel and the driving panel, a plurality of first contact holes may be defined in the display panel, a plurality of second contact holes may be defined in the driving panel, and the plurality of signal lines of the display panel and the plurality of signal lines of may be electrically connected to the driving panel, respectively, via the plurality of first contact holes and the plurality of second contact holes.

According to an embodiment, a plurality of first signal lines electrically connected to a display area may be formed on the first surface of the display panel, a plurality of second signal lines electrically connected to the plurality of first signal lines and a driver electrically connected to the plurality of second signal lines may be formed on the first surface of the driving panel, and an integrated circuit (IC) connected to the driver may be formed on the second surface of the driving panel.

According to an embodiment, a first connection portion may be formed on the second surface of the display panel, and the first connection portion is electrically connected to the plurality of first signal lines via the plurality of first contact holes, and a second connection portion connected to the first connection portion may be formed on the first surface of the driving panel, and the second connection portion is electrically connected to the plurality of second signal lines.

According to an embodiment, a plurality of third signal lines electrically connected to the driver may be formed on the first surface of the driving panel, a plurality of fourth signal lines electrically connected to the IC may be formed on the second surface of the driving panel, and each of the plurality of third signal lines may be electrically connected to the plurality of fourth signal lines via each of the plurality of second contact holes.

According to an embodiment, the filling portion may be filled in a gap between the second surface of the display panel and the first surface of the driving panel.

According to an embodiment, the display panel may overlap the driving panel in a plan view, and a size of the driving panel is less than a size of the display panel.

According to an embodiment, the driving panel may include a first driving panel and a second driving panel, the first driving panel may be arranged on an upper portion of the display panel, and the second driving panel may be arranged on a lower portion of the display panel in the plan view.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
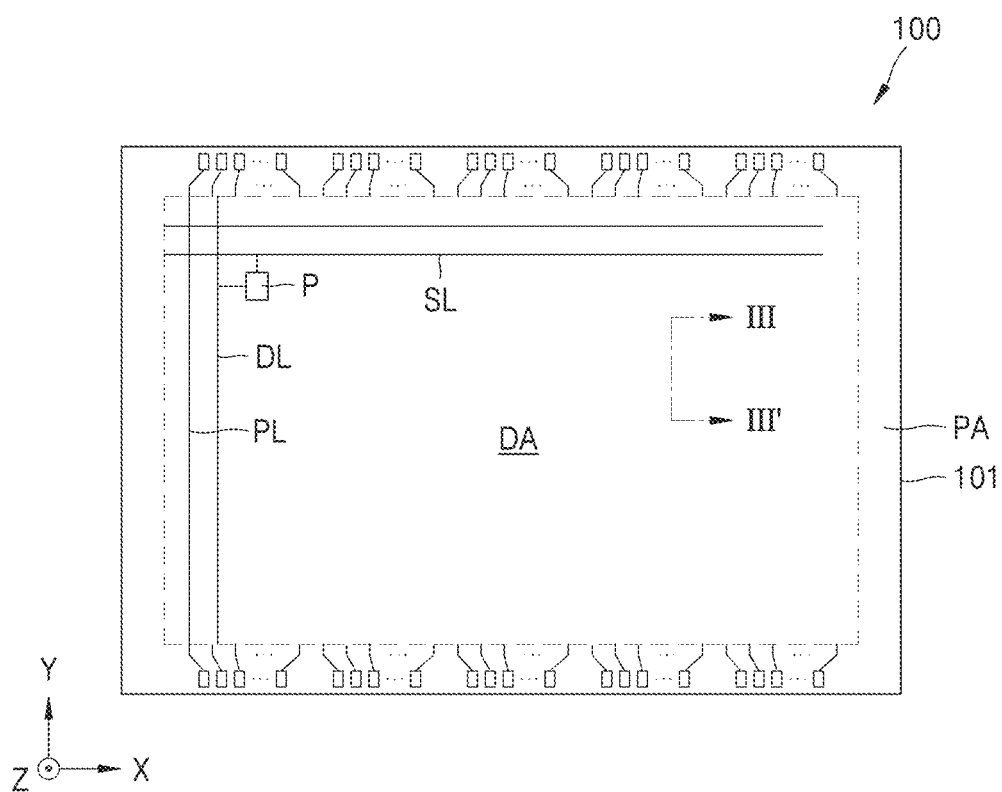
FIG. 1 is a schematic plan view of a display apparatus according to an embodiment.

Reference will now be made in detail to embodiments, examples of which are illustrated in the accompanying drawings, where like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

As the present disclosure allows for various changes and numerous embodiments, particular embodiments will be illustrated in the drawings and described in detail in the written description. Effects and features of the present disclosure and methods of achieving the same will be apparent with reference to embodiments and drawings described below in detail. The present disclosure may, however, be embodied in many different forms and should not be construed as being limited to the exemplary embodiments set forth herein.

It will be understood that when a layer, region, or component is referred to as being "formed on" another layer, region, or component, it can be directly or indirectly formed on the other layer, region, or component, for example, intervening layers, regions, or components may be present. Sizes of components in the drawings may be exaggerated for convenience of explanation. In other words, since sizes and thicknesses of components in the drawings are arbitrarily illustrated for convenience of explanation, the following embodiments are not limited thereto.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

While such terms as "first," "second," etc., may be used to describe various elements, such elements must not be limited to the above terms. The above terms are used only to distinguish one component from another.

In the following embodiments, an expression used in the singular encompasses the expression of the plural, unless it has a clearly different meaning in the context.

In the following embodiments, it is to be understood that the terms such as "including" and "having" are intended to indicate the existence of the features, or elements disclosed in the present disclosure, and are not intended to preclude the possibility that one or more other features or elements may exist or may be added.

When a certain embodiment may be implemented differently, a specific process order may be performed differently from the described order. For example, two consecutively described processes may be performed substantially at the same time or performed in an order opposite to the described order.

Hereinafter, the embodiments of the present disclosure will now be described more fully with reference to the accompanying drawings. Like reference numerals in the drawings denote like elements, and thus descriptions thereof will be omitted.

It will be understood that when a layer, region, or component is referred to as being connected to another layer, region, or component, it can be directly or indirectly connected to the other layer, region, or component. That is, for example, intervening layers, regions, or components may be present. For example, it will be understood that when a layer, region, or component is referred to as being electrically connected to another layer, region, or component, it can be directly or indirectly electrically connected to the other layer, region, or component. That is, for example, intervening layers, regions, or components may be present.

FIG. 1 is a schematic plan view of a display apparatus 100 according to an embodiment.

Referring to FIG. 1, the display apparatus 100 may be an apparatus for displaying images. Although an organic light-emitting display apparatus is described as an example of the display apparatus 100, the display apparatus of the present disclosure is not limited thereto. As another embodiment, the display apparatus 100 may be a display apparatus such as an inorganic light-emitting display apparatus or a quantum dot light-emitting display apparatus. An emission layer of a display element included in the display apparatus 100 may include an organic material, an inorganic material, a quantum dot, an organic material and a quantum dot, or an inorganic material and a quantum dot.

The display apparatus 100 includes a display area DA on a substrate 101 and a peripheral area PA extending around the display area DA. The display apparatus 100 may provide certain images by using light emitted from a plurality of pixels arranged in the display area DA.

The display area DA includes a plurality of pixels P connected to a data line DL extending in a Y-direction and a scan line SL extending in an X-direction crossing the Y-direction. Each of the plurality of pixels P may be connected to a driving voltage line PL extending in the Y-direction.

Each of the plurality of pixels P may include a display element such as an organic light-emitting diode ("OLED"). Each of the plurality of pixels P may emit red, green, blue, or white light. As another embodiment, all of the OLEDs included in the plurality of pixels P may emit the same color of light, and the color of each of the plurality of pixels P may be implemented by a color filter, a color converting layer, or the like arranged on an upper portion of the OLED in a cross-sectional view.

Figure 2:
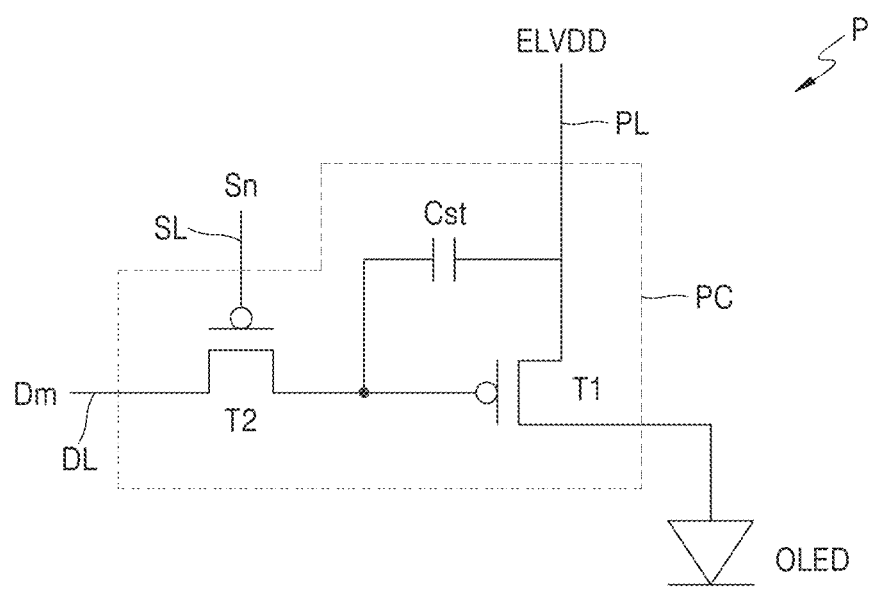
FIG. 2 is an equivalent circuit diagram of a pixel in FIG. 1.

FIG. 2 is an equivalent circuit diagram of the pixel P in FIG. 1.

Referring to FIG. 2, each pixel P includes a pixel circuit PC connected to the scan line SL and the data line DL and an organic light-emitting diode OLED connected to the pixel circuit PC.

The pixel circuit PC includes a driving thin-film transistor T1, a switching thin-film transistor T2, and a storage capacitor Cst. The switching thin-film transistor T2 is connected to the scan line SL and the data line DL and is configured to deliver, to the driving thin-film transistor T1, a data signal Dm input through the data line DL, according to a scan signal Sn input through the scan line SL.

The storage capacitor Cst is connected to the switching thin-film transistor T2 and the driving voltage line PL and store a voltage corresponding to a difference between a voltage received from the switching thin-film transistor T2 and a first power supply voltage ELVDD (or a driving voltage) supplied to the driving voltage line PL.

The driving thin-film transistor T1 may be connected to the driving voltage line PL and the storage capacitor Cst and may control a driving current flowing from the driving voltage line PL to the organic light-emitting diode OLED in accordance with a voltage value stored in the storage capacitor Cst. The organic light-emitting diode OLED may emit light having a certain brightness according to the driving current.

FIG. 2 illustrates that the pixel circuit PC includes two thin-film transistors and one storage capacitor, but the number of thin-film transistors and storage capacitors and the circuit design according to the invention are not limited thereto, and the number of thin-film transistors and storage capacitors and the circuit design may be variously changed.

Figure 3:
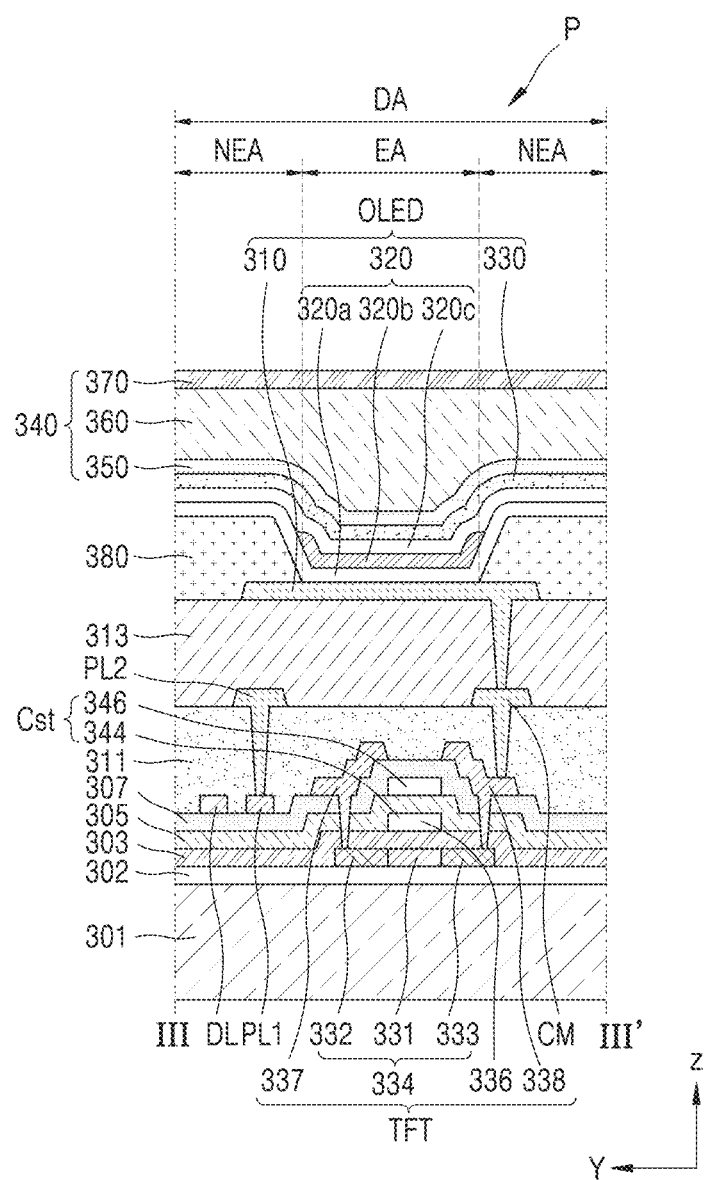
FIG. 3 is a cross-sectional view of the display apparatus taken along line III-III' of FIG. 1.

FIG. 3 is a cross-sectional view of the display apparatus 100 taken along line III-III' of FIG. 1.

Referring to FIG. 3, a display element may be arranged on a substrate 301. The display element may include a thin-film transistor TFT and an organic light-emitting diode OLED.

The substrate 301 may include glass or a polymer resin. The polymer resin may include polyethersulfone, polyacrylate, polyetherimide, polyethylene naphthalate, polyethylene terephthalate, polyphenylene sulfide, polyarylate, polyimide, polycarbonate, cellulose acetate propionate, or the like. The substrate 301 may include a single layer or a multi-layer, and may further include an inorganic layer (not shown) in a case of a multi-layer structure. The substrate 301 may be flexible, rollable, or bendable.

A buffer layer 302 may be arranged on the substrate 301. The buffer layer 302 may reduce or block penetration of foreign substances, moisture, or external air, and may provide a flat surface on the substrate 301. The buffer layer 302 may include an inorganic material such as an oxide or nitride, an organic material, or an organic and inorganic composite. The buffer layer 302 may include a single layer or multi-layer of an inorganic material and an organic material.

The thin-film transistor TFT may be arranged on the buffer layer 302. The thin-film transistor TFT may include a semiconductor layer 334, a gate electrode 336 overlapping the semiconductor layer 334 in a plan view, and a source electrode 337 and a drain electrode 338 which are electrically connected to the semiconductor layer 334. The thin-film transistor TFT may be connected to the organic light-emitting diode OLED and drive the organic light-emitting diode OLED.

The semiconductor layer 334 may be arranged on the buffer layer 302, and may include a channel area 331 overlapping the gate electrode 336 in a plan view, and a source area 332 and a drain area 333 which are arranged on both sides of the channel area 331, respectively, and include impurities at a higher concentration than that of the channel area 331. The impurities may include an N-type impurity or a P-type impurity. The source area 332 and the drain area 333 may be electrically connected to the source electrode 337 and the drain electrode 338, respectively.

The semiconductor layer 334 may include an oxide semiconductor or a silicon semiconductor. When the semiconductor layer 334 includes an oxide semiconductor, the semiconductor layer 334 may include, for example, an oxide of at least one material selected from a group including indium (In), gallium (Ga), tin (Sn), zirconium (Zr), vanadium (V), hafnium (Hf), cadmium (Cd), germanium (Ge), chromium (Cr), titanium (Ti), and zinc (Zn). For example, the semiconductor layer 334 may include indium tin zinc oxide ("ITZO"; InSnZnO), indium gallium zinc oxide ("IGTZO"; InGaZnO), or the like. When the semiconductor layer 334 includes a silicon semiconductor, the semiconductor layer 334 may include amorphous silicon (a-Si) or low temperature poly-silicon ("LTPS") in which the a-Si is crystallized.

A first gate insulating layer 303 may be arranged on the semiconductor layer 334. The first gate insulating layer 303 may include at least one inorganic insulating material selected from a group including silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or the like. The first gate insulating layer 303 may include a single layer or a multi-layer, each including the above-stated material.

The gate electrode 336 may be arranged on the first gate insulating layer 303. The gate electrode 336 may include at least one metal selected from aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), and may include a single layer or a multi-layer. The gate electrode 336 may be connected to a gate line.

A second gate insulating layer 305 may be arranged on the gate electrode 336. The second gate insulating layer 305 may include at least one inorganic insulating material selected from a group including silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or the like. The second gate insulating layer 305 may include a single layer or a multi-layer, each including the above-stated material.

The storage capacitor Cst may be arranged on the second gate insulating layer 305. The storage capacitor Cst may include a lower electrode 344 and an upper electrode 346 overlapping the lower electrode 344 in a plan view. The lower electrode 344 of the storage capacitor Cst may be connected to the gate electrode 336 of the thin-film transistor TFT and arranged as a single body. As another embodiment, the storage capacitor Cst may not overlap the thin-film transistor TFT in a plan view, and the lower electrode 344 of the storage capacitor Cst may be an independent component separate from the gate electrode 336 of the thin-film transistor TFT.

The upper electrode 346 of the storage capacitor Cst may include Al, Pt, Pd, Ag, Mg, Au, Ni, Nd, Ir, Cr, Li, Ca, Mo, Ti, W, and/or Cu, and may include a single layer or a multi-layer.

An interlayer insulating layer 307 may be arranged on the upper electrode 346 of the storage capacitor Cst. The interlayer insulating layer 307 may include at least one inorganic insulating material selected from a group including silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The interlayer insulating layer 307 may include a single layer or a multi-layer, each including the above-state material.

The data line DL, a lower driving voltage line PL1, the source electrode 337, and the drain electrode 338 may be arranged on the interlayer insulating layer 307. The data line DL, the lower driving voltage line PL1, the source electrode 337, and the drain electrode 338 may include a conductive material including Mo, Al, Cu, Ti, or the like, and may include a single layer or a multi-layer. The data line DL, the lower driving voltage line PL1, the source electrode 337, and the drain electrode 338 may include a multi-layer of Ti/Al/Ti. As an embodiment, the data line DL, the lower driving voltage line PL1, the source electrode 337, and the drain electrode 338 may include the same material.

The data line DL may be electrically connected to a data driving circuit. A data signal of the data driving circuit may be provided to the pixel P via the data line DL. Although not illustrated in FIG. 3, a scan line electrically connected to a scan driving circuit may be arranged above the first gate insulating layer 303 or the second gate insulating layer 305, and an emission control line electrically connected to an emission driving circuit may be arranged above the first gate insulating layer 303 or the second gate insulating layer 305. A scan signal of the scan driving circuit may be provided to the pixel P via the scan line, and an emission control signal of the emission driving circuit may be provided to the pixel P via the emission control line.

A first planarization layer 311 may be arranged on the data line DL, the lower driving voltage line PL1, the source electrode 337, and the drain electrode 338. The first planarization layer 311 may include a single layer or a multi-layer of a film including an organic material or an inorganic material. As an embodiment, the first planarization layer 311 may include benzocyclobutene ("BOB"), polyimide ("PI"), hexamethyldisiloxane ("HMDSO"), a general commercial polymer such as poly(methyl methacrylate) ("PMMA") or polystyrene ("PS"), a polymer derivative having a phenol group, an acrylic polymer, an imide polymer, an aryl ether polymer, an amide polymer, a fluorine polymer, a p-xylene polymer, a vinyl alcohol polymer, and a mixture thereof.

The first planarization layer 311 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or the like. After the first planarization layer 311 is formed, a chemical and mechanical polishing operation may be performed on the first planarization layer 311 to provide a flat top surface.

An upper driving voltage line PL2 and a contact metal layer CM may be arranged on the first planarization layer 311. The upper driving voltage line PL2 and the contact metal layer CM may include Al, Cu, Ti, or the like, and may include a multi-layer or a single layer. The upper driving voltage line PL2 and the contact metal layer CM may include a multi-layer of Ti/Al/Ti. As an embodiment, the upper driving voltage line PL2 and the contact metal layer CM may include the same material.

The upper driving voltage line PL2 may be electrically connected to the lower driving voltage line PL1 through a contact hole penetrating the first planarization layer 311 to prevent a voltage drop of a driving voltage provided through a driving voltage line. Here, the upper driving voltage line PL2 is located on upper portion than the lower driving voltage line PL1 in the cross-sectional view.

The contact metal layer CM may be electrically connected to the thin-film transistor TFT through a contact hole penetrating the first planarization layer 311, and a pixel electrode 310 may be electrically connected to the contact metal layer CM through a contact hole penetrating a second planarization layer 313.

The second planarization layer 313 may be arranged on the upper driving voltage line PL2 and the contact metal layer CM. The second planarization layer 313 may include a single layer or a multi-layer of a film including an organic material or an inorganic material. As an embodiment, the second planarization layer 313 may include BCB, PI, HMDSO, a general commercial polymer such as PMMA or PS, a polymer derivative having a phenol group, an acrylic polymer, an imide polymer, an aryl ether polymer, an amide polymer, a fluorine polymer, a p-xylene polymer, a vinyl alcohol polymer, and a mixture thereof.

The second planarization layer 313 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or the like. After the second planarization layer 313 is formed, a chemical and mechanical polishing operation may be performed on the second planarization layer 313 to provide a flat top surface.

The organic light-emitting diode OLED including the pixel electrode 310, an intermediate layer 320, and an opposite electrode 330 may be arranged on the second planarization layer 313. The pixel electrode 310 may be electrically connected to the contact metal layer CM through a contact hole penetrating the second planarization layer 313, and the contact metal layer CM may be electrically connected to the source electrode 337 and the drain electrode 338 of the thin-film transistor TFT through a contact hole penetrating the first planarization layer 311, and thus, the organic light-emitting diode OLED may be electrically connected to the thin-film transistor TFT.

The pixel electrode 310 may be arranged on the second planarization layer 313. The pixel electrode 310 may include a (semi)transparent electrode or a reflective electrode. The pixel electrode 310 may include a reflective film and a transparent or semi-transparent electrode layer formed above the reflective film, the reflective film including Al, Pt, Pd, Ag, Mg, Au, Ni, Nd, Ir, Cr, Li, Ca, Mo, Ti, W, Cu, and a compound thereof. The transparent or semi-transparent electrode layer may include at least one selected from a group including indium tin oxide ("ITO"), indium zinc oxide ("IZO"), zinc oxide (ZnO), indium oxide ($In_2O_3$), indium gallium oxide ("IGO"), and aluminum zinc oxide ("AZO"). The pixel electrode 310 may include ITO/Ag/ITO.

A pixel defining film 380 may be arranged on the second planarization layer 313, and the pixel defining film 380 may have an opening exposing at least a portion of the pixel electrode 310. An area exposed by the opening of the pixel defining film 380 may be defined as an emission area EA. The periphery of the emission area EA may be a non-emission area NEA, and the non-emission area NEA may surround the emission area EA. In detail, the display area DA may include a plurality of emission areas EA and the non-emission area NEA surrounding the plurality of emission areas EA. The pixel defining film 380 may prevent an arc or the like from being generated at an edge of the pixel electrode 310 by increasing a distance between the pixel electrode 310 and the opposite electrode 330 above the pixel electrode 310. The pixel defining film 380 may include an organic insulating material such as polyimide, polyamide, an acrylic resin, BCB, HMDSO, a phenol resin, or the like, and may be formed in a spin coating method or the like.

The intermediate layer 320 may be arranged on the pixel electrode 310 which is at least partially exposed by the pixel defining film 380. The intermediate layer 320 may include an emission layer 320b, and a first functional layer 320a and a second functional layer 320c may be selectively arranged on and below the emission layer 320b.

The first functional layer 320a may include a hole injection layer ("HIL") and/or a hole transport layer ("HTL"), and the second functional layer 320c may include an electron transport layer ("ETL") and/or the electron injection layer ("EIL").

The emission layer 320b may include a low-molecular-weight organic material or a polymer organic material.

When the emission layer 320b includes a low-molecular-weight organic material, the intermediate layer 320 may include a structure in which a HIL, a HTL, an emission layer, an ETL, an EIL, or the like are stacked in a single or complex structure.

The low-molecular-weight organic material may include various organic materials, such as copper phthalocyanine (CuPc), N,N'-Di(napthalene-1-yl)-N,N'-diphenyl-benzidine, tris-8-hydroxyquinoline aluminum (Alq3), or the like. The layers may be formed by a vacuum deposition method.

When the emission layer 320b includes a polymer organic material, the intermediate layer 320 may include a structure including a HTL and an emission layer. At this time, the HTL may include poly(3,4-ethylenedioxythiophene) ("PEDOT"), and the emission layer may include a polymer material such as poly(p-phenylene vinylene) ("PPV"), polyfluorene, or the like. The emission layer may be formed by a screen printing method, an inkjet printing method, a laser induced thermal imaging ("LITI") method, or the like.

The opposite electrode 330 may be arranged on the intermediate layer 320. The opposite electrode 330 may cover the intermediate layer 320. As an embodiment, the opposite electrode 330 may be arranged above the display area DA and may cover the display area DA. The opposite electrode 330 may be formed by using an open mask as a single body on an entire panel to cover the plurality of pixels P arranged in the display area DA.

The opposite electrode 330 may include a conductive material having a low work function. For example, the opposite electrode 330 may include a (semi)transparent layer, the (semi)transparent layer including Ag, Mg, Al, Pt, Pd, Au, Ni, Nd, Ir, Cr, Li, Ca, alloys thereof, or the like. The opposite electrode 330 may further include a layer such as ITO, IZO, ZnO, or $In_2O_3$ above the (semi)transparent layer including the above-stated material.

The organic light-emitting diode OLED may be covered by a thin-film encapsulation layer 340. The thin-film encapsulation layer 340 may include at least one inorganic encapsulation layer and at least one organic encapsulation layer. As an embodiment, the thin-film encapsulation layer 340 may include a first inorganic encapsulation layer 350, a second inorganic encapsulation layer 370, and an organic encapsulation layer 360 arranged between the first inorganic encapsulation layer 350 and the second inorganic encapsulation layer 370.

Each of the first inorganic encapsulation layer 350 and the second inorganic encapsulation layer 370 may include one or more inorganic insulating materials. The inorganic insulating material may include aluminum oxide, titanium oxide, tantalum oxide, hafnium oxide, zinc oxide, silicon oxide, silicon nitride, and/or silicon oxynitride. The organic encapsulation layer 360 may include a polymer-based material. The polymer-based material may include an acrylic resin, an epoxy resin, polyimide, polyethylene, or the like. For example, the organic encapsulation layer 360 may include an acrylic resin, PMMA, polyacrylic acid, or the like.

Figure 4A:
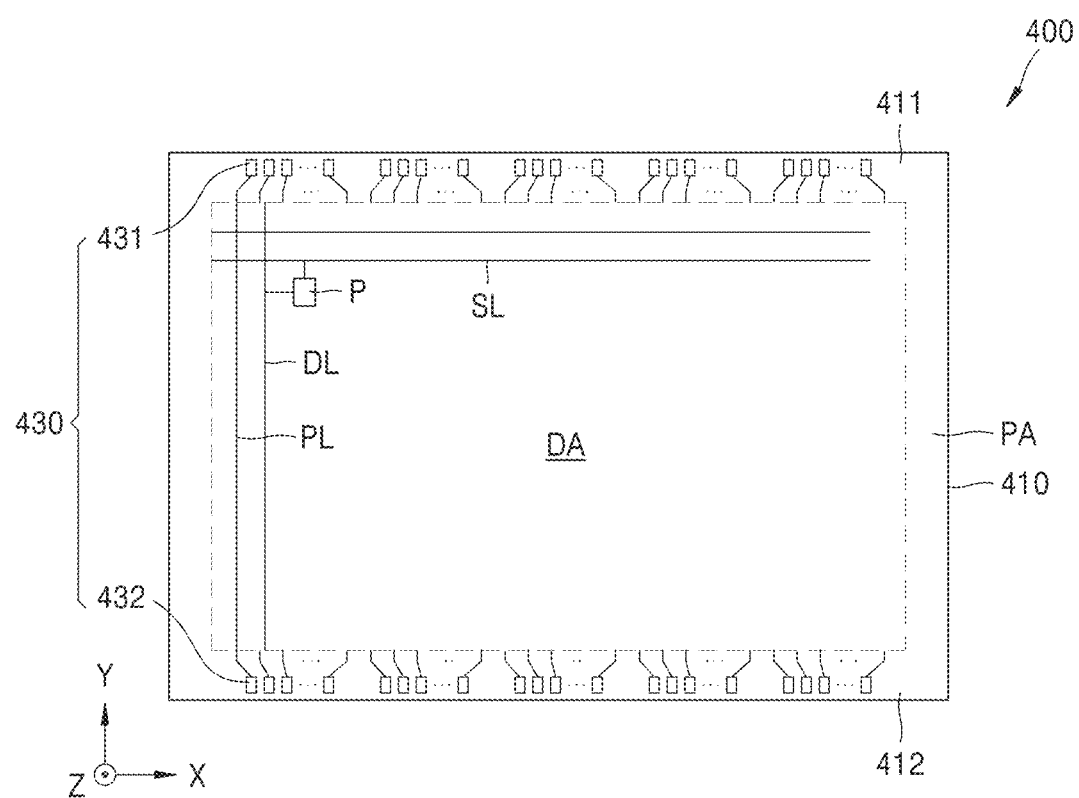
FIG. 4A is a plan view of a first surface of a display panel according to an embodiment.
Figure 4B:
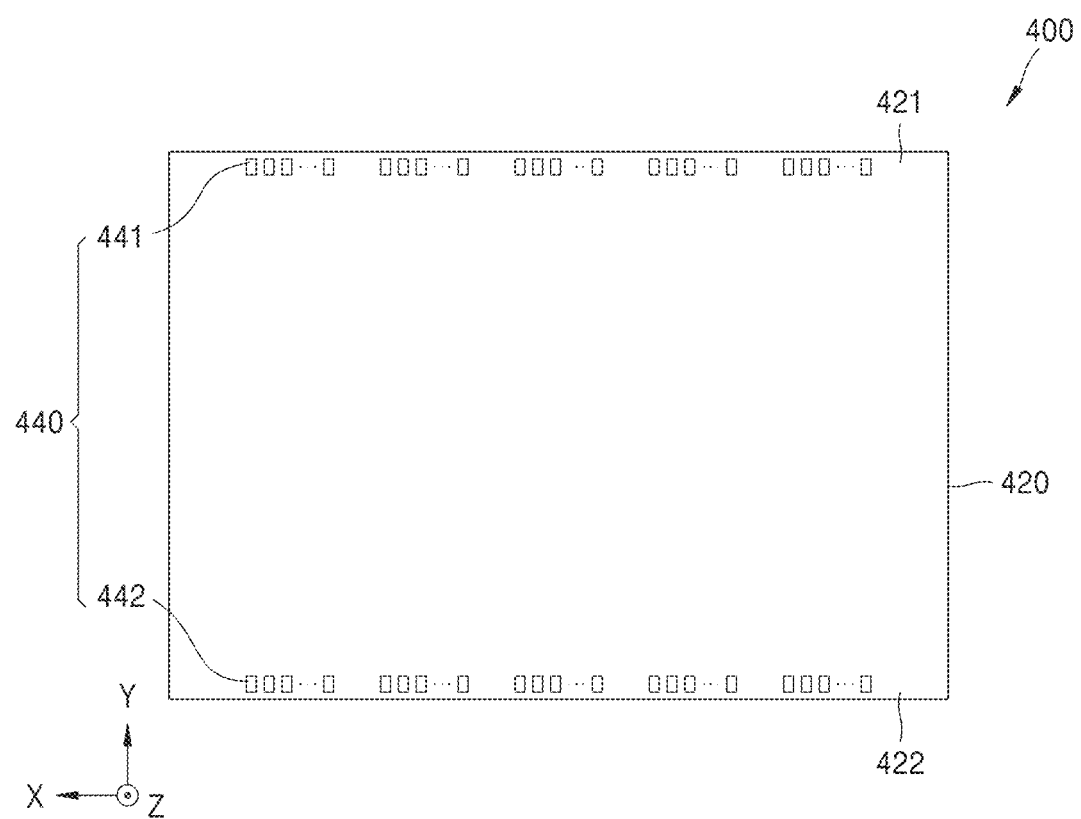
FIG. 4B is a plan view of a second surface of the display panel of FIG. 4A.
Figure 5A:
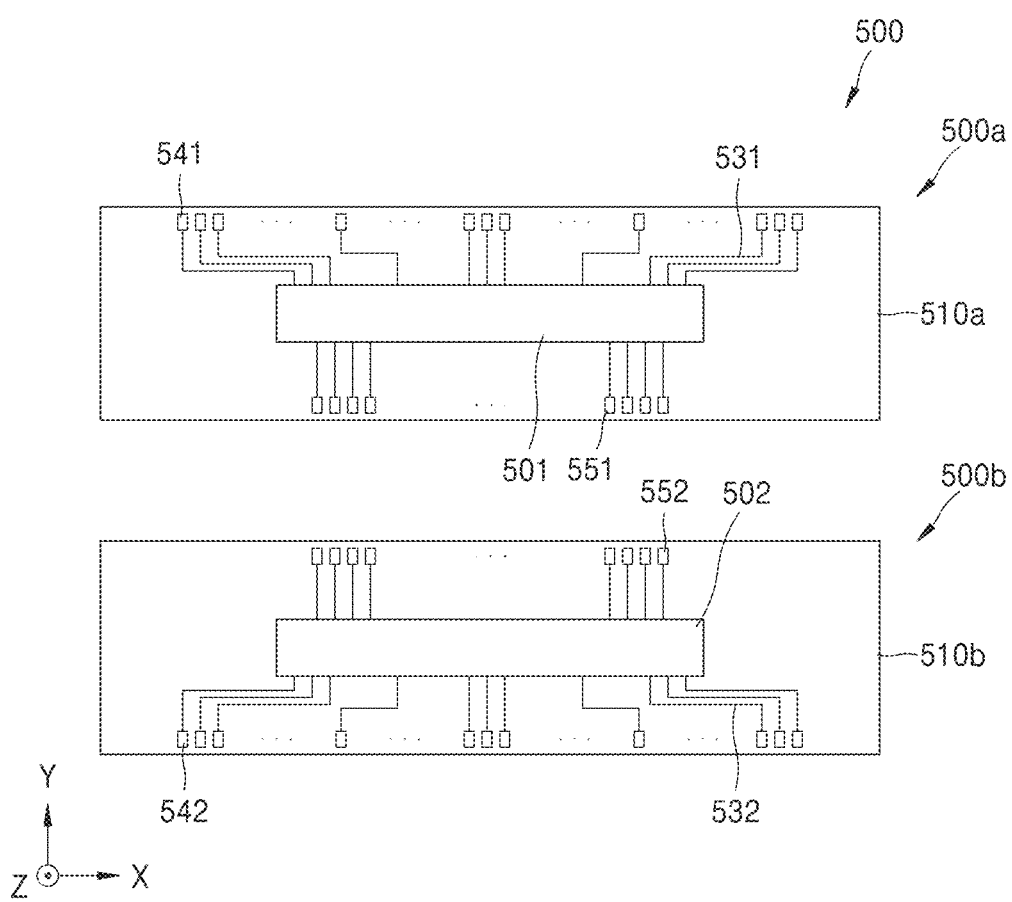
FIG. 5A is a plan view of a first surface of a driving panel according to an embodiment.
Figure 5B:
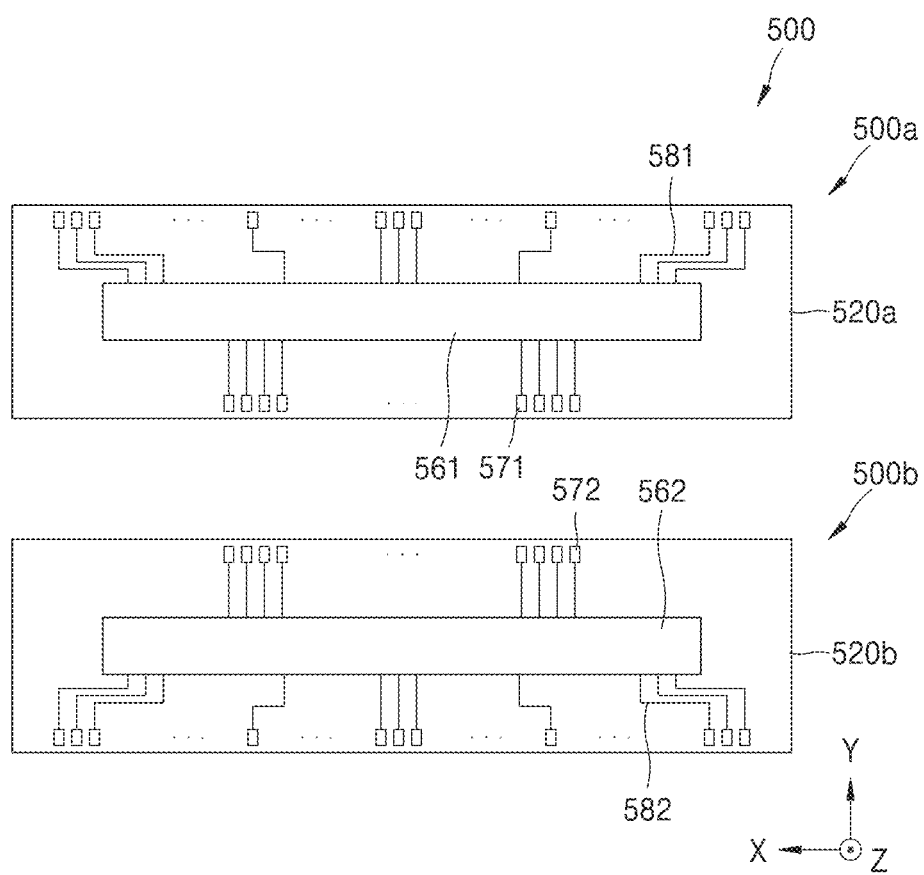
FIG. 5B is a plan view of a second surface of the driving panel of FIG. 5A.

The display apparatus 100 includes a display panel 400 (shown in FIGS. 4A and 4B) and a driving panel 500 (shown in FIGS. 5A and 5B). The driving panel 500 may be arranged above the display panel 400 in a plan view (i.e., Z-direction). The display panel 400 and the driving panel 500 may be separated from each other in a vertical direction (i.e., Z-direction). Outer circuits, such as a data driver, a scan driver, and a control driver, may be arranged in the driving panel 500, where the outer circuits are connected to signal lines such as the data line DL, the scan line SL, an emission control line EM, or the like, and the signal lines are electrically connected to a display element arranged in the display area DA.

FIG. 4A is a plan view of a first surface 410 of the display panel 400, and FIG. 4B is a plan view of a second surface 420 of the display panel 400 of FIG. 4A, according to an embodiment.

Referring to FIG. 4A, the display area DA for displaying images may be arranged on the first surface 410 of the display panel 400, and the peripheral area PA may be arranged around the display area DA. The peripheral area PA may surround the display area DA. The display panel 400 includes a structure in which the substrate 301 and the thin-film encapsulation layer 340 shown in FIG. 3 are combined. The display element of FIG. 3 may be arranged in the display area DA.

A plurality of first signal lines 430 may be arranged in upper and lower portions of the peripheral area PA outside the display area DA. In detail, in a X-direction of the display panel 400, a plurality of first upper signal lines 431 may be arranged in an upper peripheral area 411, and a plurality of first lower signal lines 432 may be arranged in a lower peripheral area 412. The plurality of first upper signal lines 431 and the plurality of first lower signal lines 432 may transfer electrical signals to a display element arranged in the display area DA. The plurality of first upper signal lines 431 and the plurality of first lower signal lines 432 may alternately transfer signals to the display area DA. As another embodiment, one of the plurality of first upper signal lines 431 or the plurality of first lower signal lines 432 may be arranged in one of the upper peripheral area 411 or the lower peripheral area 412.

Referring to FIG. 4B, the second surface 420 of the display panel 400 may be a surface opposite to the first surface 410 of the display panel 400 in a thickness direction (i.e., Z-direction) of the display panel 400. Here, the first surface 410 may be a lower surface of the display panel 400, and the second surface 420 may be an upper surface of the display panel 400 in a cross-sectional view (See FIG. 7). A plurality of first connection portions 440 electrically connected to the plurality of first signal lines 430 may be arranged on the second surface 420 of the display panel 400. In detail, in the X-direction of the display panel 400, a plurality of first upper connection portions 441 may be arranged in an upper peripheral area 421, and a plurality of first lower connection portions 442 may be arranged in a lower peripheral area 422. The plurality of first upper connection portions 441 may be arranged in positions corresponding to the plurality of first upper signal lines 431, respectively, and the plurality of first lower connection portions 442 may be arranged in positions corresponding to the plurality of first lower signal lines 432, respectively.

Each of the plurality of first upper signal lines 431 may be electrically connected to each of the plurality of first upper connection portions 441 through a first contact hole (490 in FIG. 7) penetrating the display panel 400 in the thickness direction (i.e., Z-direction). Each of the plurality of first lower signal lines 432 may be electrically connected to each of the plurality of first lower connection portions 442 through the first contact hole 490. A conductive material may be filled in the first contact hole 490 to electrically connect the first signal line 430 to the first connection portion 440.

FIG. 5A is a plan view of a first surface of the driving panel 500, and FIG. 5B is a plan view of a second surface of the driving panel 500 of FIG. 5A, according to an embodiment.

Referring to FIG. 5A, the driving panel 500 may include a first driving panel 500a and a second driving panel 500b. The first driving panel 500a and the second driving panel 500b may be panels having substantially the same structure. The first driving panel 500a may be arranged on an upper portion of the display panel 400, and the second driving panel 500b may be arranged on a lower portion of the display panel 400. Here, the part or element shown in FIGS. 4A-5B and named with "upper" or "lower" describes the relative location of the part or element in a plan view (i.e., "upper" means that it is located in +Y-direction from the center, and "lower" means that it is located in −Y-direction from the center), and the part or element shown in FIGS. 3 and 7 and named with "upper" or "lower" describes the relative location of the part or element in a cross-sectional view (i.e., "upper" means that it is located in +Z-direction from the center, and "lower" means that it is located in −Z-direction from the center). As another embodiment, one of the first driving panel 500a or the second driving panel 500b may be provided.

A first surface 510a of the first driving panel 500a may face the second surface 420 of the display panel 400. A plurality of second upper signal lines 531 may be arranged on the first surface 510a of the first driving panel 500a and electrically connected to the plurality of first upper signal lines 431 (See FIG. 7). The plurality of second upper signal lines 531 may be electrically connected to an upper driver 501. The plurality of second upper signal lines 531 may have a fan-out shape.

A plurality of second upper connection portions 541 may be arranged on the first surface 510a of the first driving panel 500a. Each of the plurality of second upper connection portions 541 may be electrically connected to each of the plurality of second upper signal lines 531. The plurality of second upper connection portions 541 may be arranged at a position corresponding to the plurality of first upper connection portions 441. Each of the plurality of first upper connection portions 441 may be electrically connected to each of the plurality of second upper connection portions 541 via a bump (710 in FIG. 7). A plurality of third upper signal lines 551 may be arranged on the first surface 510a of the first driving panel 500a and electrically connected to the upper driver 501.

A plurality of second lower signal lines 532 may be arranged on the first surface 510b of the second driving panel 500b and electrically connected to the plurality of first lower signal lines 432. The plurality of second lower signal lines 532 may be electrically connected to a lower driver 502. The plurality of second lower signal lines 532 may have a fan-out shape.

A plurality of second lower connection portions 542 may be arranged on the first surface 510b of the second driving panel 500*b*. Each of the plurality of second lower connection portions 542 may be connected to each of the plurality of second lower signal lines 532. The plurality of second lower connection portions 542 may be arranged at a position corresponding to the plurality of first lower connection portions 442. Each of the plurality of first lower connection portions 442 may be electrically connected to each of the plurality of second lower connection portions 542 via the bump 710. Each of the plurality of third lower signal lines 552 may be arranged on the first surface 510*b* of the second driving panel 500*b* and electrically connected to the lower driver 502.

Referring to FIG. 5B, a second surface 520*a* of the first driving panel 500*a* may be a surface opposite to the first surface 510*a* of the first driving panel 500*a* in a thickness direction of the first driving panel 500*a*. Here, the first surface 510*a* may be a lower surface of the first driving panel 500*a*, and the second surface 520*a* may be an upper surface of the first driving panel 500*a* in a cross-sectional view (See FIG. 7).

A plurality of fourth upper signal lines 571 may be arranged on the second surface 520*a* of the first driving panel 500*a* and electrically connected to the plurality of third upper signal lines 551. Each of the plurality of third upper signal lines 551 may be electrically connected to each of the plurality of fourth upper signal lines 571 through a second contact hole (590 in FIG. 7) penetrating the first driving panel 500*a* in the thickness direction. The plurality of fourth upper signal lines 571 may be electrically connected to an upper integrated circuit (IC) 561. The upper IC 561 may be electrically connected to a plurality of external upper signal lines 581, and the plurality of external upper signal lines 581 is electrically connected to a terminal of an external circuit board.

A plurality of fourth lower signal lines 572 may be arranged on a second surface 520*b* of the second driving panel 500*b* and electrically connected to the plurality of third lower signal lines 552. Each of the plurality of third lower signal lines 552 may be electrically connected to each of the plurality of fourth lower signal lines 572 through the second contact hole 590 penetrating the second driving panel 500*b* in the thickness direction. The plurality of fourth lower signal lines 572 may be electrically connected to a lower IC 562. The lower IC 562 may be electrically connected to a plurality of external lower signal lines 582, and the plurality of external lower signal lines 582 is electrically connected to a terminal of an external circuit board.

As such, the upper driver 501 may be arranged on the first surface 510*a* of the first driving panel 500*a*, and the lower driver 502 may be arranged on the first surface 510*b* of the second driving panel 500*b*. In detail, the upper driver 501 and the lower driver 502 may not be arranged on the display panel 400, but may be arranged on the first driving panel 500*a* and the second driving panel 500*b*, respectively, separated from the display panel 400. An electrical signal may be transferred to a display element arranged in the display area DA via a plurality of signal lines respectively arranged on both surfaces of the display panel 400 and both surfaces of the driving panel 500.

In an embodiment, for example, the upper driver 501 and/or the lower driver 502 may be a data driving circuit, and may be electrically connected to the data line DL. A data signal of the data driving circuit may be provided to the pixel P through the data line DL.

As an embodiment, the upper driver 501 and/or the lower driver 502 may be a scan driving circuit, and may be electrically connected to the scan line SL. A scan signal of the scan driving circuit may be provided to the pixel P through the scan line SL.

As an embodiment, the upper driver 501 and/or the lower driver 502 may be an emission driving circuit, and may be electrically connected to the emission control line EM. An emission control signal of the emission driving circuit may be provided to the pixel P through the emission control line EM.

As an embodiment, the upper driver 501 and/or the lower driver 502 may be a switching circuit. The switching circuit may demux (i.e., demultiplex) the data signal output from the data driving circuit and supply the demuxed data signal to the data line DL.

Figure 6:
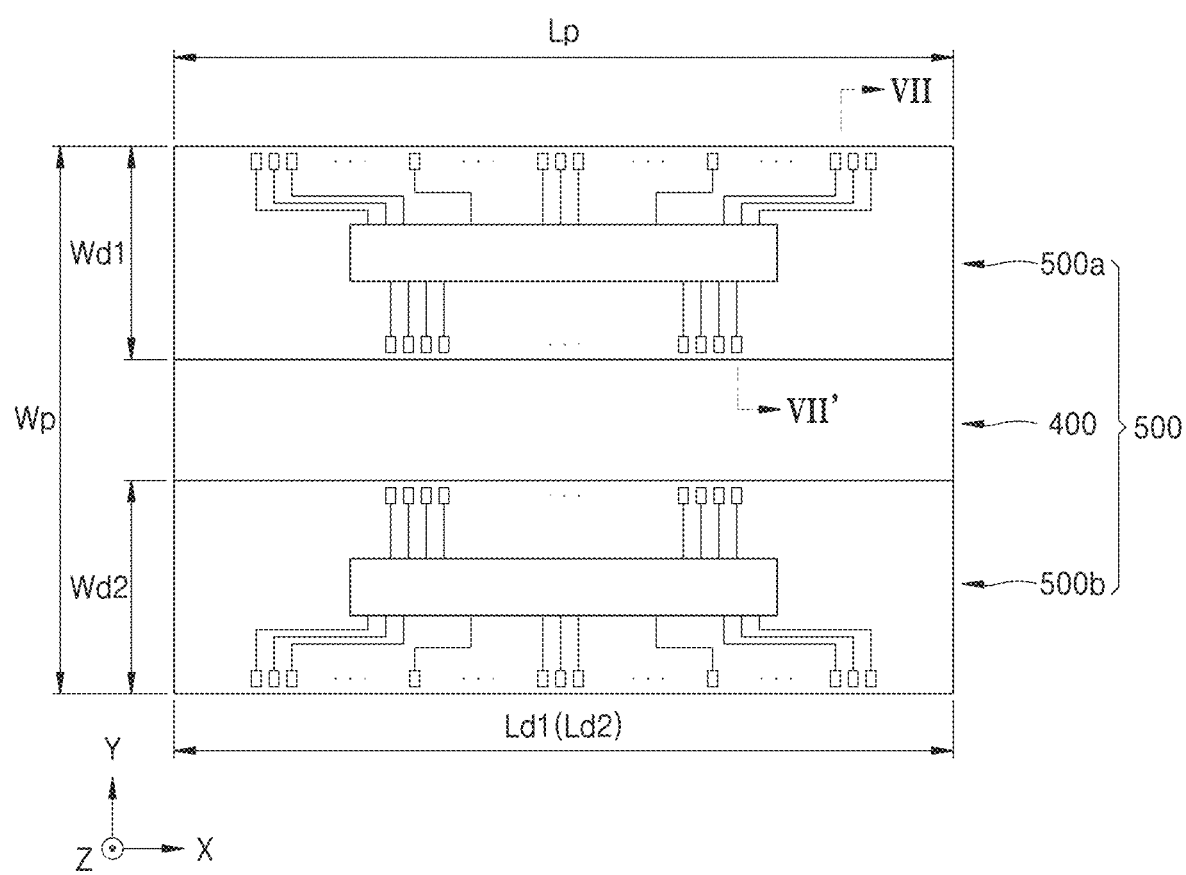
FIG. 6 is a plan view illustrating a display panel and a driving panel arranged according to an embodiment.

FIG. 6 is a plan view illustrating the display panel 400 and the driving panel 500 arranged according to an embodiment.

Referring to FIG. 6, the driving panel 500 may be arranged on the display panel 400. The display panel 400 and the driving panel 500 may be separately arranged and overlap each other in a plan view.

The size (i.e., area) of each of the first driving panel 500*a* and the second driving panel 500*b* may be less than the size (i.e., area) of the display panel 400 in a plan view. Accordingly, the first driving panel 500*a* may be arranged on the upper portion of the display panel 400 in the X-direction. The second driving panel 500*b* may be arranged on the lower portion of the display panel 400 in the X-direction.

In an embodiment, for example, a width Wp of the display panel 400 in the Y direction may be greater than a width Wd1 of the first driving panel 500*a* or a width Wd2 of the second driving panel 500*b*. In addition, the width Wp of the display panel 400 may be greater than the sum of the width Wd1 of the first driving panel 500*a* and the width Wd2 of the second driving panel 500*b* in the Y direction. On the other hand, a length Lp of the display panel 400 in the X direction may be the same as a length Ld1 of the first driving panel 500*a* or a length Ld2 of the second driving panel 500*b*. As long as the size (i.e., area) of the driving panel 500 is less than the size (i.e., area) of the display panel 400 in a plan view and is arranged within an area in which the display panel 400 is arranged, the size of any one of the driving panel 500 and the display panel 400 is not limited to any specific value.

Figure 7:
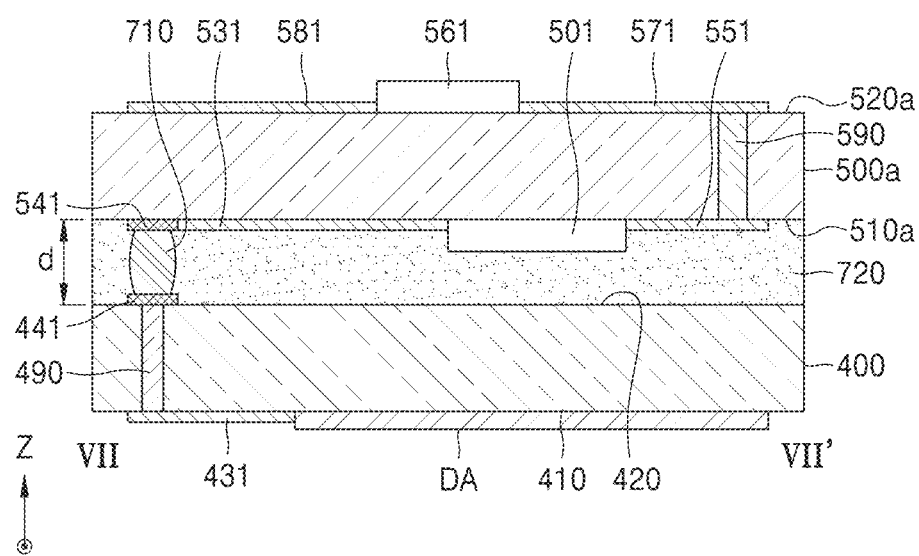
FIG. 7 is a cross-sectional view of the display panel and the driving panel taken along line VII-VII' of FIG. 6.

FIG. 7 is a cross-sectional view of the display panel 400 and the driving panel 500 taken along line VII-VII' of FIG. 6.

Herein, although a structure in which the display panel 400 and the first driving panel 500*a* are coupled is illustrated in FIG. 7, a structure in which the display panel 400 and the second driving panel 500*b* are coupled may be substantially the same. Therefore, a description thereof will be omitted.

Referring to FIG. 7, as described above, the display panel 400 and the driving panel (500 in FIG. 5A) may be stacked in a vertical direction (i.e., Z-direction). The display area DA for displaying images and the first upper signal line 431 electrically connected to the display area DA may be arranged on the first surface 410 of the display panel 400. The first upper connection portion 441 may be arranged on the second surface 420 of the display panel 400 and electrically connected to the first upper signal line 431. The first upper signal line 431 may be electrically connected to the first upper connection portion 441 through the first contact hole 490 penetrating the display panel 400 in the thickness direction (Z-direction).

The second upper signal line 531 and the upper driver 501 electrically connected to the second upper signal line 531 may be arranged on the first surface 510*a* of the first driving panel 500a. The second upper signal line 531 may be electrically connected to the first upper signal line 431. In detail, the second upper connection portion 541 may be arranged on the first surface 510a of the first driving panel 500a at a position corresponding to the first upper connection portion 441. The bump 710 may be arranged between the first upper connection portion 441 and the second upper connection portion 541 and electrically connect the first upper connection portion 441 to the second upper connection portion 541.

The upper driver 501 arranged on the first surface 510a of the first driving panel 500a may be electrically connected to the upper IC 561 arranged on the second surface 520a of the first driving panel 500a. In detail, the third upper signal line 551 electrically connected to the upper driver 501 may be arranged of the first surface 510a of the first driving panel 500a. The plurality of fourth upper signal lines 571 electrically connected to the upper IC 561 may be arranged on the second surface 520a of the first driving panel 500a. The third upper signal line 551 may be electrically connected to the plurality of fourth upper signal lines 571 through the second contact hole 590 penetrating the first driving panel 500a in the thickness direction (i.e., Z-direction).

A filling unit 720 may be arranged between the display panel 400 and the first driving panel 500a which are stacked in the vertical direction (Z-direction). In detail, a distance d in the Z-direction may exist between the second surface 420 of the display panel 400 and the first surface 510a of the first driving panel 500a. The upper driver 501 and a connection portion of the first upper connection portion 441 and the second upper connection portion 541 may be arranged which the distance d. The filling unit 720 may be arranged within the distance d. The filling unit 720 may protect the upper driver 501 and the connection portion of the first upper connection portion 441 and the second upper connection portion 541. In addition, the filling unit 720 may fix the display panel 400 and the first driving panel 500a to each other.

The filling unit 720 may include a resin. As an embodiment, the filling unit 720 may include an organic material such as methyl silicone, phenyl silicone, polyimide, or the like. As another embodiment, the filling unit 720 may include a urethane resin, an epoxy resin, an acrylic resin, which are an organic sealant, or silicon or the like which is an inorganic sealant.

Electrical signal transmission of the display apparatus 100 having the above-stated structure may be as follows.

As an electrical path in the first driving panel 500a, an electrical signal may be transferred in an order of the upper IC 561, the fourth upper signal line 571, the second contact hole 590, the third upper signal line 551, the upper driver 501, the second upper signal line 531, and the second upper connection portion 541.

As an electrical path between the first driving panel 500a and the display panel 400, an electrical signal may be transferred in an order of the second upper connection portion 541, the bump 710, and the first upper connection portion 441.

As an electrical path in the display panel 400, an electrical signal may be transferred in an order of the first upper connection portion 441, the first contact hole 490, the first upper signal line 431, and the display area DA.

FIGS. 8A to 8E sequentially illustrate an operation of manufacturing the display apparatus 100 according to an embodiment.

Figure 8A:
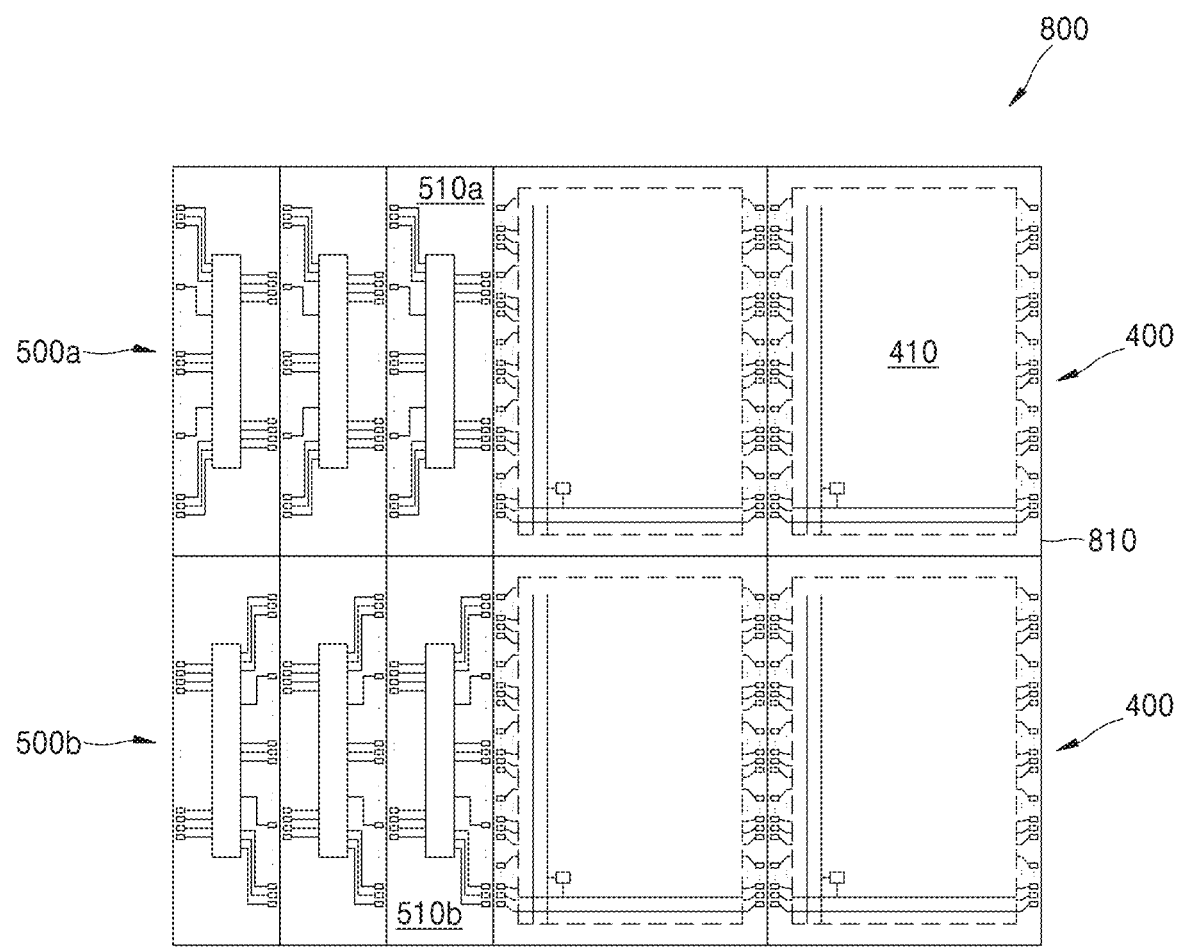
FIGS. 8A to 8E are diagrams sequentially illustrating an operation of manufacturing a display apparatus according to an embodiment.

Referring to FIG. 8A, a mother substrate 800 is provided. The mother substrate 800 has a size capable of simultaneously manufacturing a plurality of display panels 400 and a plurality of driving panels 500. Each of the plurality of display panels 400 and each of the plurality of driving panels 500 may include substrates having the same material. The mother substrate 800 may include glass or a polymer resin. A glass substrate may include an alkali-free glass. The polymer resin may include polyethersulfone, polyacrylate, polyetherimide, polyethylene naphthalate, polyethylene terephthalate, polyphenylene sulfide, polyarylate, polyimide, polycarbonate, cellulose acetate propionate, or the like.

Display elements and components such as signal lines arranged on the first surface 410 of each of the plurality of display panels 400 are patterned on a first surface 810 of the mother substrate 800. At the same time, display elements and components such as signal lines arranged on the first surface 510a of each of the plurality of first driving panels 500a and the first surface 510b of each of the plurality of second driving panels 500b are patterned on the first surface 810 of the mother substrate 800.

Figure 8B:
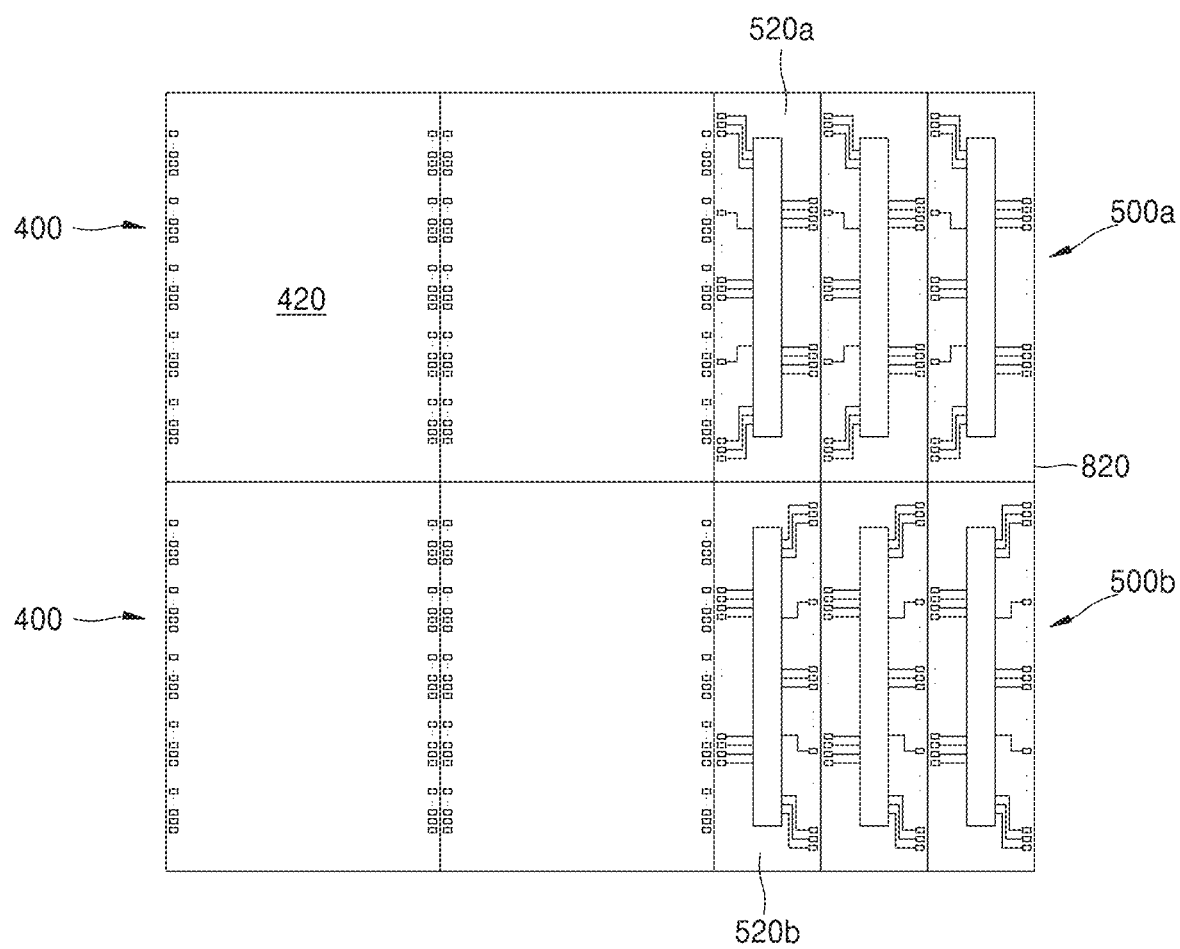

Referring to FIG. 8B, when a first pattern operation of the first surface 810 of the mother substrate 800 is completed, the mother substrate 800 is inverted. Display elements and components such as signal lines arranged on the second surface 420 of each of the plurality of display panels 400 are patterned on a second surface 820 of the mother substrate 800. At the same time, display elements and components such as signal lines arranged on the second surface 520a of each of the plurality of first driving panels 500a and the second surface 520b of each of the plurality of second driving panels 500b are patterned on the second surface 820 of the mother substrate 800.

Figure 8C:
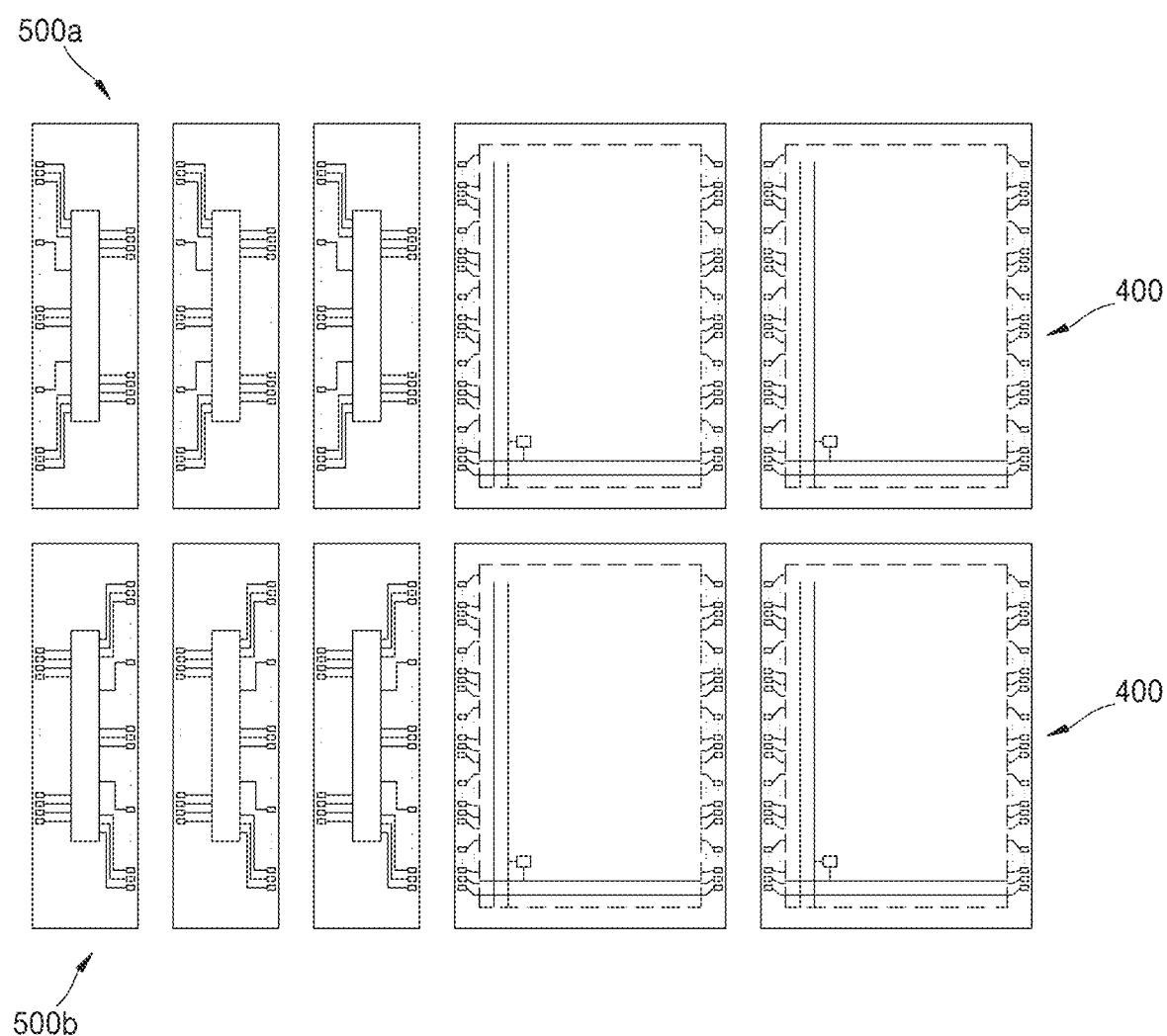

Referring to FIG. 8C, the mother substrate 800 is cut. The plurality of display panels 400, the plurality of first driving panels 500a, and the plurality of second driving panels 500b are separated into a single display panel 400, a single first driving panel 500a, and a single second driving panel 500b by using a cutting device such as a cutting wheel or a laser device.

Figure 8D:
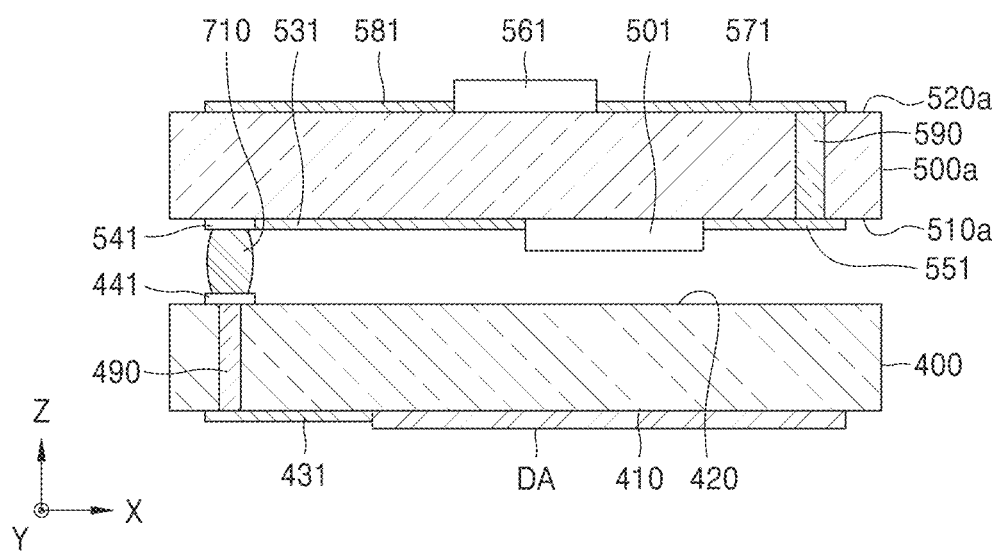

Referring to FIG. 8D, the single first driving panel 500a is arranged on the single display panel 400, and the first driving panel 500a is electrically connected to the display panel 400. At this time, the second surface 420 of the display panel 400 and the first surface 510a of the first driving panel 500a are arranged to face each other. The first upper connection portion 441 and the second upper connection portion 541 are electrically connected by the bump 710.

Although not illustrated in FIG. 8C, the single second driving panel 500b is arranged on the single display panel 400, and the second driving panel 500b is electrically connected to the display panel 400. The second surface 420 of the display panel 400 and the first surface 510b of the second driving panel 500b are arranged to face each other, and the first lower connection portion 442 and the second lower connection portion 542 are electrically connected by the bump 710.

Figure 8E:
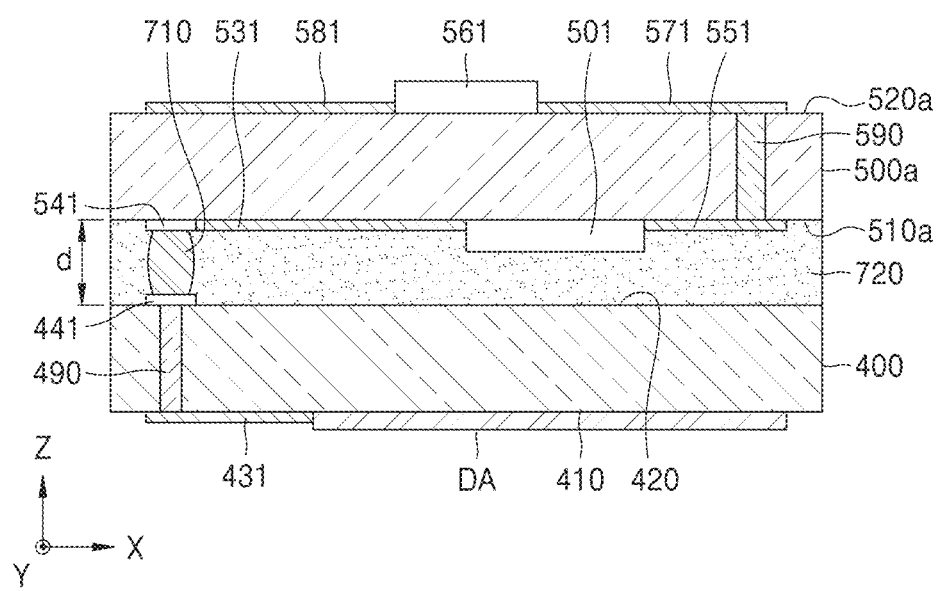

Referring to FIG. 8E, the filling unit 720 may be arranged between the single display panel 400 and the single first driving panel 500a. The distance d may exist between the second surface 420 of the display panel 400 and the first surface 510a of the first driving panel 500a, and the filling unit 720 including a resin may be filled in the distance d (i.e., gap). Although not illustrated in FIG. 8E, the distance d may also exist between the second surface 420 of the single display panel 400 and the first surface 510b of the single second driving panel 500b, and the filling unit 720 may be filled in the gap.

Through the operation as described above, the combination of the single first driving panel 500a and the single second driving panel 500b to the display panel 400 is completed.

Figure 9:
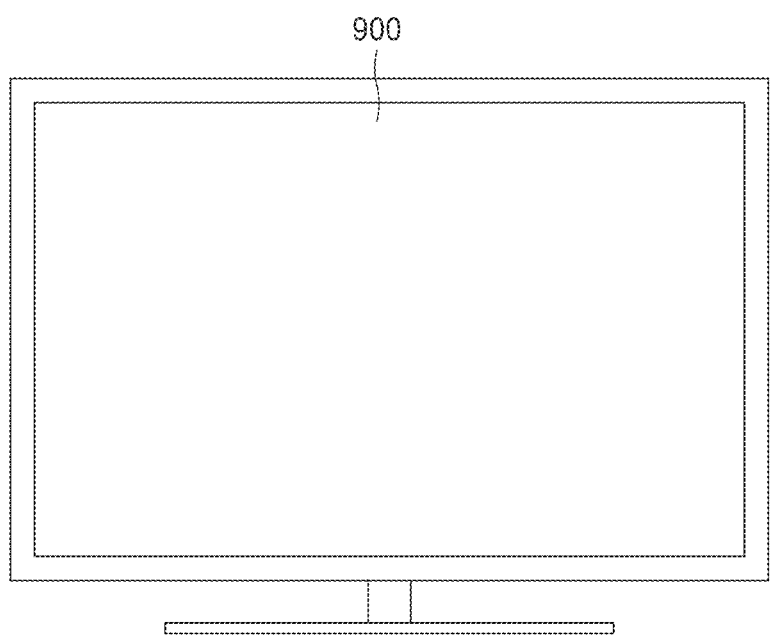
FIGS. 9 and 10 are each a diagram of an electronic device including a display apparatus according to an embodiment.
Figure 10:
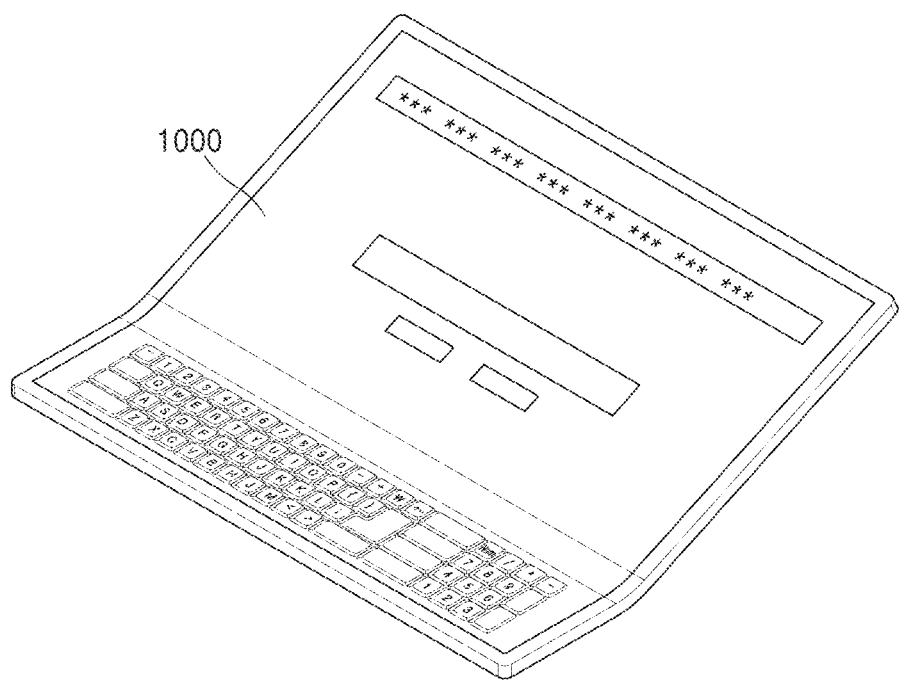

FIGS. 9 and 10 are each a diagram of an electronic device including display apparatuses 900 and 1000, respectively, according to an embodiment.

Referring to FIGS. 9 and 10, the display apparatuses 900 and 1000 may include an electronic device such as a television or a monitor, or an electronic device such as a notebook computer. Alternatively, the display apparatuses 900 and 1000 may be used in various electronic devices such as a smart picture frame or a large billboard.

The display apparatuses 900 and 1000 are used not only in electronic devices having a horizontally long rectangular screen. In another embodiment, for example, the display apparatuses 900 and 1000 may be used in electronic devices having a vertically long rectangular screen.

A display apparatus and a method of manufacturing the same according to an aspect of the present disclosure may separate a display panel and a driving panel and transfer an electrical signal from a driver arranged on the driving panel to the display panel, thereby minimizing dead space around the panels.

Effects of the present disclosure may be derived from the contents described below with reference to the accompanying drawings, in addition to the above descriptions.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
a display panel comprising a first surface and a second surface opposite to the first surface, wherein a display area which displays images is arranged in the first surface;
a driving panel arranged on the display panel and comprising a first surface and a second surface, the first surface of the driving panel facing the second surface of the display panel, and the second surface of the driving panel being opposite to the first surface of the driving panel; and
a filling portion filled between the display panel and the driving panel,
wherein the display panel and the driving panel are stacked in a vertical direction in a cross-sectional view, and
signal lines of the display panel are electrically connected to signal lines of the driving panel, respectively, through a contact hole penetrating the display panel and the driving panel.

2. The display apparatus of claim 1, wherein the contact hole includes a plurality of first contact holes and a plurality of second contact holes,
the plurality of first contact holes is defined in the display panel, and
the plurality of second contact holes is defined in the driving panel.

3. The display apparatus of claim 2, wherein a plurality of first signal lines electrically connected to the display area is arranged on the first surface of the display panel,
a plurality of second signal lines electrically connected to the plurality of first signal lines and a driver electrically connected to the plurality of second signal lines are arranged on the first surface of the driving panel, and
an integrated circuit (IC) electrically connected to the driver is arranged on the second surface of the driving panel.

4. The display apparatus of claim 3, wherein a first connection portion is arranged on the second surface of the display panel, and is electrically connected to the plurality of first signal lines through the plurality of first contact holes, and
a second connection portion is arranged on the first surface of the driving panel to contact the first connection portion and be electrically connected to the plurality of second signal lines.

5. The display apparatus of claim 4, wherein a bump is between the first connection portion and the second connection portion.

6. The display apparatus of claim 3, wherein a plurality of third signal lines is electrically connected to the driver and arranged on the first surface of the driving panel,
a plurality of fourth signal lines is electrically connected to the IC and arranged on the second surface of the driving panel, and
each of the plurality of third signal lines is electrically connected to and each of the plurality of fourth signal lines via each of the plurality of second contact holes.

7. The display apparatus of claim 3, wherein the driver arranged in the driving panel is configured to apply a signal to a display element arranged in the display area.

8. The display apparatus of claim 1, wherein the filling portion is filled in a gap between the second surface of the display panel and the first surface of the driving panel.

9. The display apparatus of claim 1, wherein the display panel overlaps the driving panel in a plan view, and
a size of the driving panel is less than a size of the display panel.

10. The display apparatus of claim 9, wherein the driving panel comprises a first driving panel and a second driving panel,
the first driving panel is arranged on an upper portion of the display panel, and
the second driving panel is arranged on a lower portion of the display panel in the plan view.

11. The display apparatus of claim 1, wherein the signal lines of the display panel and the signal lines of the driving panel are arranged on substrates, respectively, the substrates comprising a same material.

* * * * *